United States Patent
Zhu et al.

(10) Patent No.: US 9,263,279 B2
(45) Date of Patent: Feb. 16, 2016

(54) COMBINING CUT MASK LITHOGRAPHY AND CONVENTIONAL LITHOGRAPHY TO ACHIEVE SUB-THRESHOLD PATTERN FEATURES

(71) Applicant: QUALCOMM Incorporated, San Diego, CA (US)

(72) Inventors: John J. Zhu, San Diego, CA (US); Zhongze Wang, San Diego, CA (US); Da Yang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 97 days.

(21) Appl. No.: 13/864,344

(22) Filed: Apr. 17, 2013

(65) Prior Publication Data
US 2014/0312500 A1    Oct. 23, 2014

(51) Int. Cl.
*H01L 21/28* (2006.01)
*H01L 21/31* (2006.01)
*H01L 21/469* (2006.01)
*H01L 21/283* (2006.01)
*H01L 21/768* (2006.01)
*H01L 23/50* (2006.01)
*G03F 7/20* (2006.01)
*H01L 23/00* (2006.01)

(52) U.S. Cl.
CPC ............ *H01L 21/283* (2013.01); *G03F 7/7045* (2013.01); *G03F 7/70466* (2013.01); *H01L 21/76895* (2013.01); *H01L 23/50* (2013.01); *H01L 21/28123* (2013.01); *H01L 21/31* (2013.01); *H01L 21/469* (2013.01); *H01L 24/27* (2013.01); *H01L 24/31* (2013.01); *H01L 2924/0002* (2013.01)

(58) Field of Classification Search
CPC .............. H01L 24/027; H01L 24/0274; H01L 24/28123; H01L 24/31; H01L 24/469; H01L 24/478; H01L 24/79635; H01L 21/28123; H01L 21/31; H01L 21/469; H01L 21/478; H01L 21/79635
See application file for complete search history.

(56) References Cited

U.S. PATENT DOCUMENTS

| | | | |
|---|---|---|---|
| 6,200,726 B1 * | 3/2001 | Chen et al. | 430/270.1 |
| 6,620,715 B1 | 9/2003 | Blosse et al. | |
| 6,787,469 B2 * | 9/2004 | Houston | H01L 27/1104 257/E21.314 |
| 7,794,614 B2 | 9/2010 | Weis et al. | |
| 8,264,044 B2 * | 9/2012 | Becker | 257/369 |
| 8,334,211 B2 * | 12/2012 | Kewley | 438/696 |

(Continued)

OTHER PUBLICATIONS

International Search Report and Written Opinion—PCT/US2014/033790—ISA/EPO—Oct. 1, 2014.

*Primary Examiner* — David Zarneke
(74) *Attorney, Agent, or Firm* — Seyfarth Shaw LLP

(57) ABSTRACT

Features are fabricated on a semiconductor chip. The features are smaller than the threshold of the lithography used to create the chip. A method includes patterning a first portion of a feature (such as a local interconnect) and a second portion of the feature to be separated by a predetermined distance, such as a line tip to tip space or a line space. The method further includes patterning the first portion with a cut mask to form a first sub-portion (e.g., a contact) and a second sub-portion. A dimension of the first sub-portion is less than a dimension of a second predetermined distance, which may be a line length resolution of a lithographic process having a specified width resolution. A feature of a semiconductor device includes a first portion and a second portion having a dimension less than a lithographic resolution of the first portion.

7 Claims, 9 Drawing Sheets

(56) References Cited

U.S. PATENT DOCUMENTS

| | | | |
|---|---|---|---|
| 8,865,598 B2* | 10/2014 | Sant et al. | 438/717 |
| 2002/0160590 A1* | 10/2002 | Hashimoto | G03F 7/0035 438/528 |
| 2002/0176029 A1 | 11/2002 | Fujino | |
| 2009/0004577 A1* | 1/2009 | Shim | 430/5 |
| 2009/0091729 A1 | 4/2009 | Marokkey et al. | |
| 2009/0169832 A1 | 7/2009 | Aton | |
| 2010/0130016 A1 | 5/2010 | Devilliers | |
| 2010/0164614 A1* | 7/2010 | Hou | G06F 17/5072 327/565 |
| 2011/0236836 A1 | 9/2011 | Park et al. | |
| 2012/0118854 A1 | 5/2012 | Smayling et al. | |
| 2012/0180016 A1 | 7/2012 | Chidambaram et al. | |
| 2012/0208361 A1* | 8/2012 | Ha | 438/597 |
| 2012/0225552 A1* | 9/2012 | Blatchford | 438/637 |
| 2013/0157437 A1* | 6/2013 | Yanai et al. | 438/424 |

* cited by examiner

COMBINING CUT MASK LITHOGRAPHY AND CONVENTIONAL LITHOGRAPHY TO ACHIEVE SUB-THRESHOLD PATTERN FEATURES

FIELD

Aspects of the present disclosure relate generally to semiconductor device design and manufacture, and more particularly to lithographic processes used in the semiconductor manufacturing process.

BACKGROUND

Photolithographic technology plays an important role in the manufacture of integrated circuits (ICs) (also referred to as semiconductor chips.) Improvements in lithography have enabled the printing of smaller features of integrated circuits. This, in turn, has allowed for production of more densely populated integrated circuits and more powerful and cost-effective semiconductor devices.

However, there are times when even the most advanced techniques, e.g., use of laser light or lower wavelength light for exposure of the mask geometries, still have limitations that are unable to achieve specific designs.

Lithographic processes are often referred to by the smallest feature, which may be the line width, spacing between lines, or the distance from line tip to line tip. The smallest feature in a given lithographic process is often referred to as the "threshold," in that the threshold distance is the smallest distance that can be produced using a certain lithographic technique. Currently, there are "20 nanometer" or "30 nanometer" technologies, which indicate that the smallest feature, which can be the width of a trace on a semiconductor device, is used as the name for that technology. So, a 20 nm process can produce a feature as small as 20 nm.

When small features are being produced, there is often a need to create a contact pad or other sub-portion of a feature that is smaller than the process limitation. This may only happen in a few places on a chip. Because such features cannot be consistently manufactured, the chip layout is redesigned to accommodate these limitations, which takes up additional semiconductor real estate and increases costs of the ICs.

It can be seen, then, that there is a need in the art to achieve sub-threshold features within a semiconductor chip.

SUMMARY

The present disclosure describes methods and apparatuses for fabricating features on a semiconductor chip that are smaller than the threshold of the lithography used to create the chip.

A method of making a semiconductor device in accordance with one aspect of the present disclosure includes patterning a first portion of a feature and a second portion of the feature separated by a first predetermined distance. The method further includes patterning the first portion with a cut mask to form a first sub-portion and a second sub-portion. A dimension of the first sub-portion is less than a dimension of a second predetermined distance.

A feature of a semiconductor device in accordance with another aspect of the present disclosure includes a first portion. The feature further includes a second portion having a dimension less than a lithographic resolution of the first portion.

A computer program product configured for making a semiconductor device in accordance with another aspect of the present disclosure includes a non-transitory computer-readable medium having non-transitory program code recorded thereon. The non-transitory program code includes program code to pattern a first portion of a feature and a second portion of the feature separated by a first predetermined distance. The non-transitory program code further includes program code to pattern the first portion with a out mask to form a first sub-portion and a second sub-portion. A dimension of the first sub-portion is less than a dimension of a second predetermined distance.

In yet another aspect, an apparatus for making a semiconductor device has means for patterning a first portion of a feature and a second portion of the feature separated by a first predetermined distance. The apparatus also has means for patterning the first portion to form a first sub-portion and a second sub-portion. A dimension of the first sub-portion is less than a dimension of a second predetermined distance.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Figure 1A:
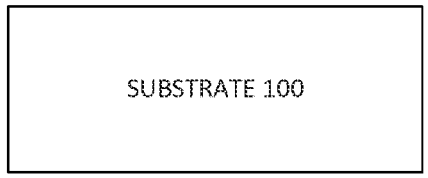
FIGS. 1A-1E illustrate a conventional build-up of a semiconductor device.

FIG. 1A illustrates a side view of a substrate 100. The substrate 100 can be silicon, or can be other semiconductor materials, such as gallium arsenide (GaAs), gallium nitride (GaN), other single-element or compound semiconductors, or even glass, sapphire, quartz, sapphire, high-resistivity silicon, or other like semiconductor materials without departing from the scope of the present disclosure. The substrate 100 may also have dopant wells, or have other layers of device film or patterns already present. Such wells and layers are not shown in FIGS. 1A-1E for clarity.

Figure 1B:
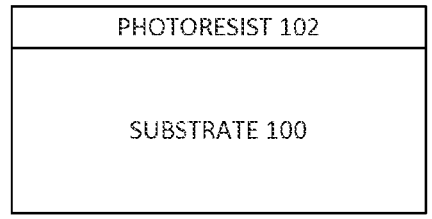

To fabricate patterns on the substrate 100, a layer of photoresist 102 is applied to the substrate 100 as shown in FIG. 1B. The photoresist 102 can be applied via spin techniques or by coating the substrate 100 with a spray or misting of photoresist 102. Photoresist 102 is usually a light-sensitive polymer that, after exposure to certain wavelengths of light, can be selectively removed from substrate 100.

Figure 1C:
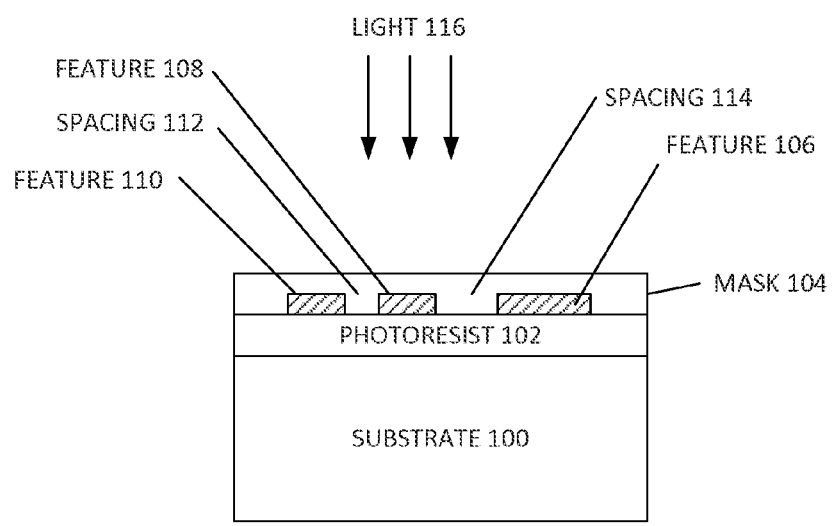

FIG. 1C shows a mask 104 placed on the photoresist 102. The mask 104 has features 106, 108, and 110, and spacings 112 and 114. As an example, and not by way of limitation, the mask 104 is shown where feature 106 is larger than features 108 and 110, and spacing 114 is larger than spacing 112. Also as an example, and not by way of limitation, features 108 and 110 are at the threshold of the lithographic technique being used in conjunction with the mask 104. Thus, these features 108 and 110 are, for purposes of the explanation of the present disclosure, the smallest features that can be transferred to the substrate 100 through the photoresist 102. Although shown as creating features 106, 108, 110 and spacings 112 and 114 with a mask, such features can be patterned, or otherwise made using direct exposure of the photoresist with a laser/light source, or through other means, without departing from the scope of the present disclosure.

Figure 1D:
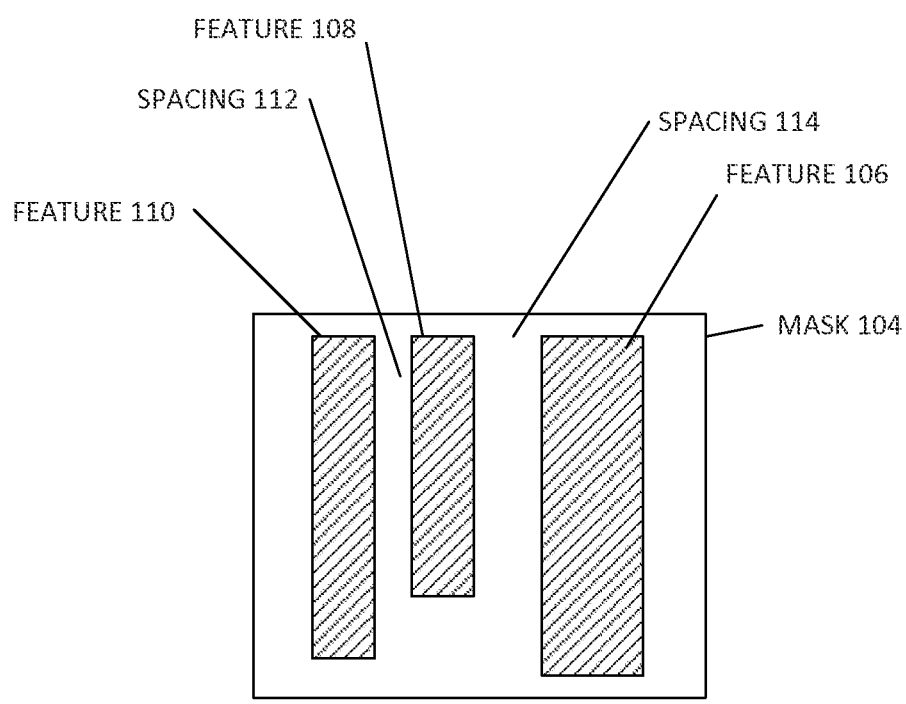

Also as shown in FIG. 1C, for purposes of discussion, spacing 112 is smaller than the threshold of the lithographic technique used in conjunction with the mask 104. Light 116 will selectively expose the photoresist 102 through the features 106, 108, 110 and spacings 112 and 114, which will allow for selective removal of the photoresist 102 and processing of the substrate 100. FIG. 1D illustrates a top view of the mask 104, where the light 116 would be shining onto the page from the perspective of the reader.

Figure 1E:
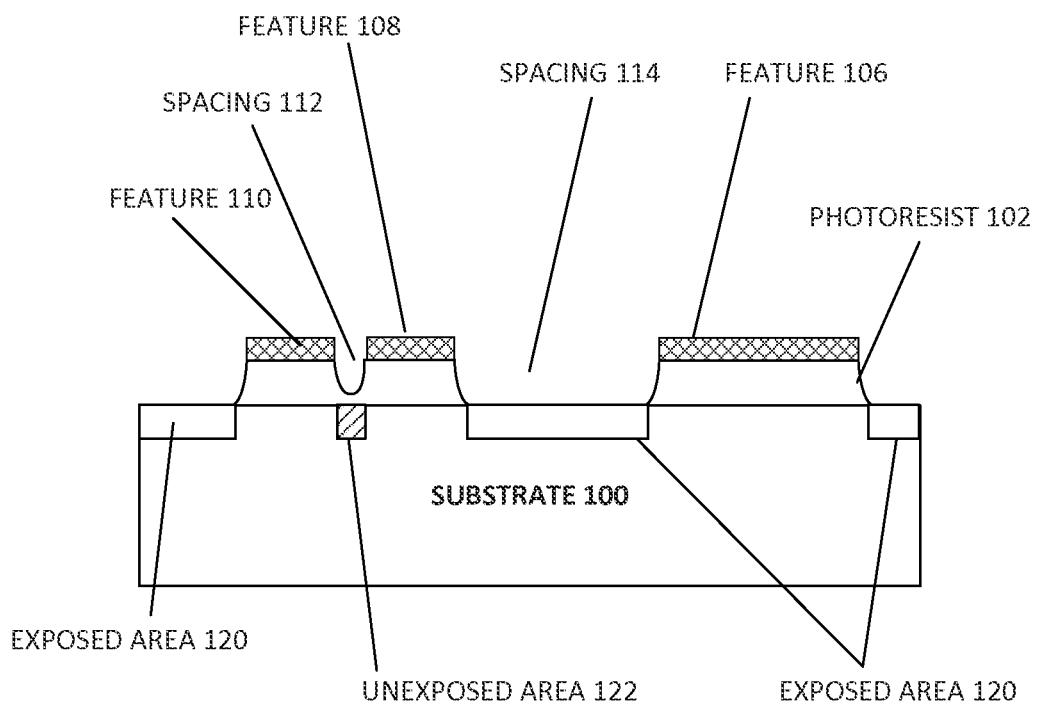

FIG. 1E illustrates the photoresist layer 102 after exposure to the light 116 and removal of the exposed photoresist. Features 106, 108, and 110, and spacings 112 and 114, are shown in phantom to illustrate their effect on the photoresist 102 exposure. The wavelength of light 116, as well as the mask 104 or other techniques used to expose the photoresist layer 102 can contribute to the lithographic resolution of the process described in FIGS. 1A-1E.

Exposed areas 120 are shown where the photoresist was fully exposed to light 116. The exposed areas 120 are now available for further processing of the substrate 100. For example, the exposed areas 120 can now be metalized, or have dopants implanted, as desired within the design of the devices to be placed on substrate 100.

However, although the design of the mask 104 also used spacing 112, which was below the threshold feature size of mask 104, unexposed area 122 cannot be processed as desired. Thus, the unexposed area, which is designed to receive similar processing as exposed areas 120, will not receive that processing, or will receive incomplete processing, because the photoresist 102 was not fully exposed in the spacing 112. This results in the substrate 100 having defects in the overall circuitry because the unexposed area 122 has not received the proper processing due to the feature size of the spacing 112.

As additional masks 104 are used, or other lithographic processes are employed to further pattern or process the substrate 100, the substrate 100 may have additional problems because the unexposed area 122 may affect the additional processing. Moreover, the other masks 104 may have similar problems.

Although the "sub-threshold" issue illustrated in FIG. 1A-1E is related to a sub-threshold spacing 112 between features 108 and 110, the sub-threshold issue of the present disclosure can also be related to other sub-threshold feature sizes, including feature width, e.g., width 214, feature length, feature tip-to-tip space, and other feature dimensions.

The present disclosure allows for the fabrication of sub-threshold features, which may include a sub-threshold line length.

Figure 2A:
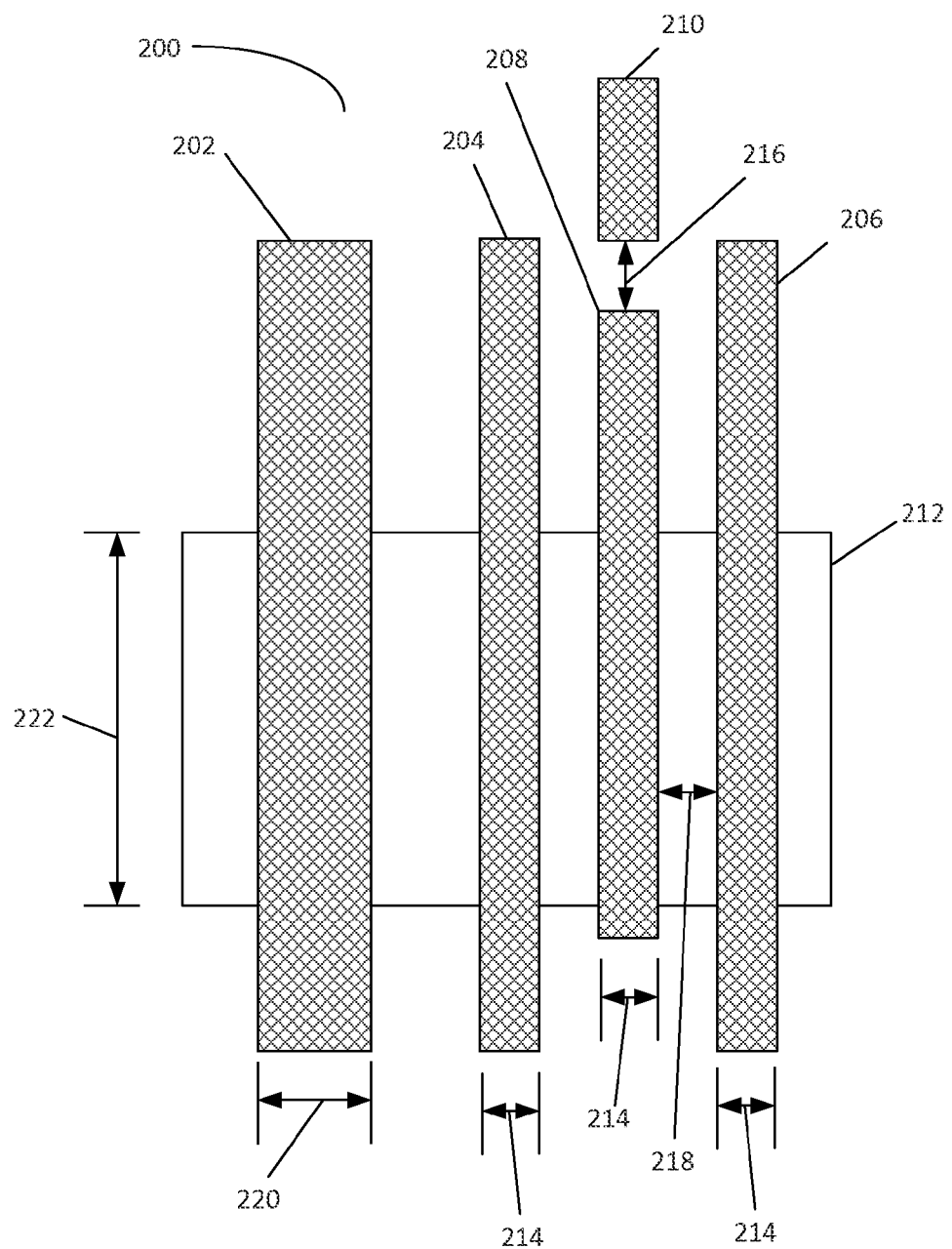
FIG. 2A illustrates a top view of features created on a semiconductor substrate in accordance with an aspect of the present disclosure.
Figure 2B:
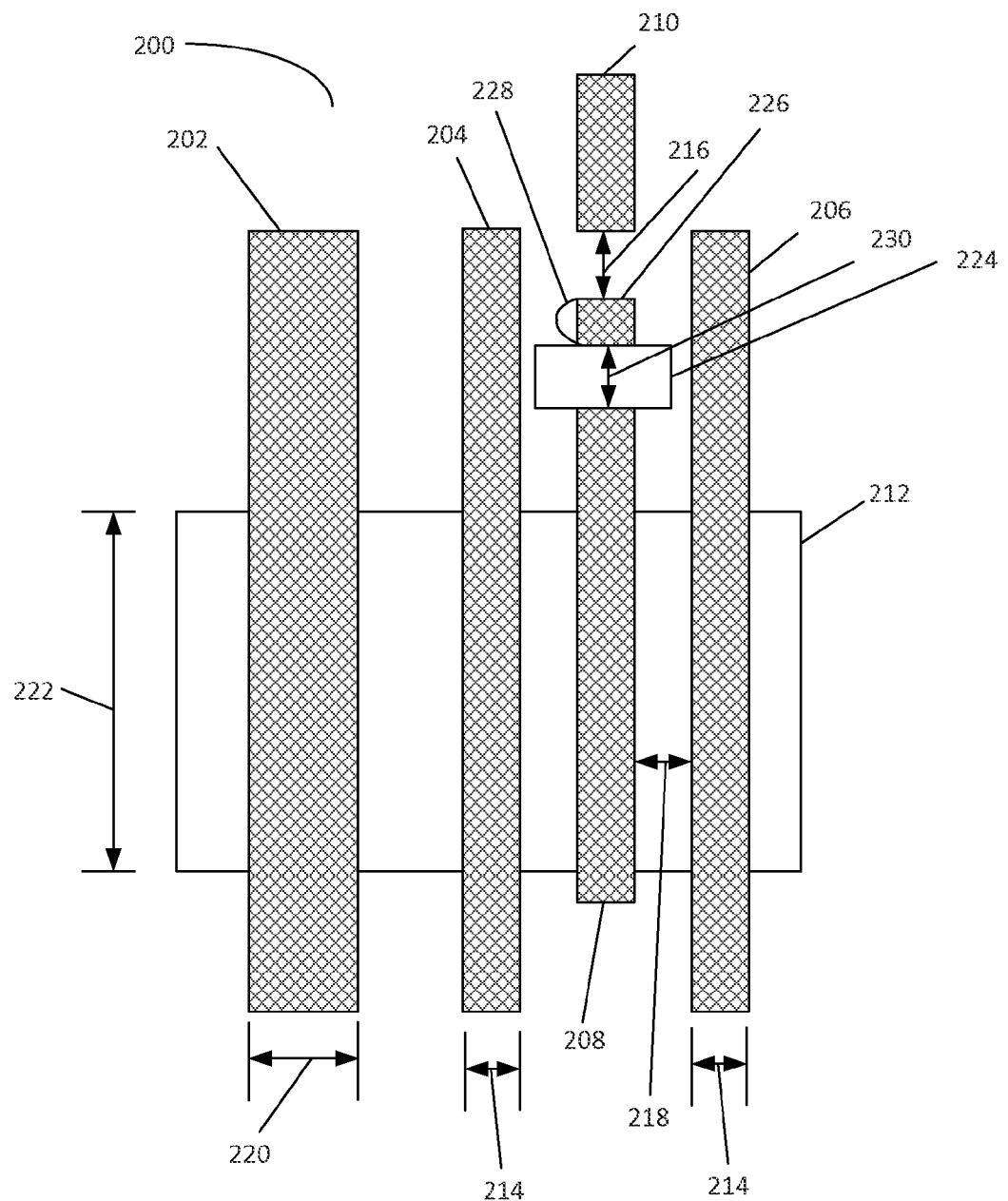
FIG. 2B illustrates use of a cut mask according to one aspect of the disclosure.
Figure 2C:
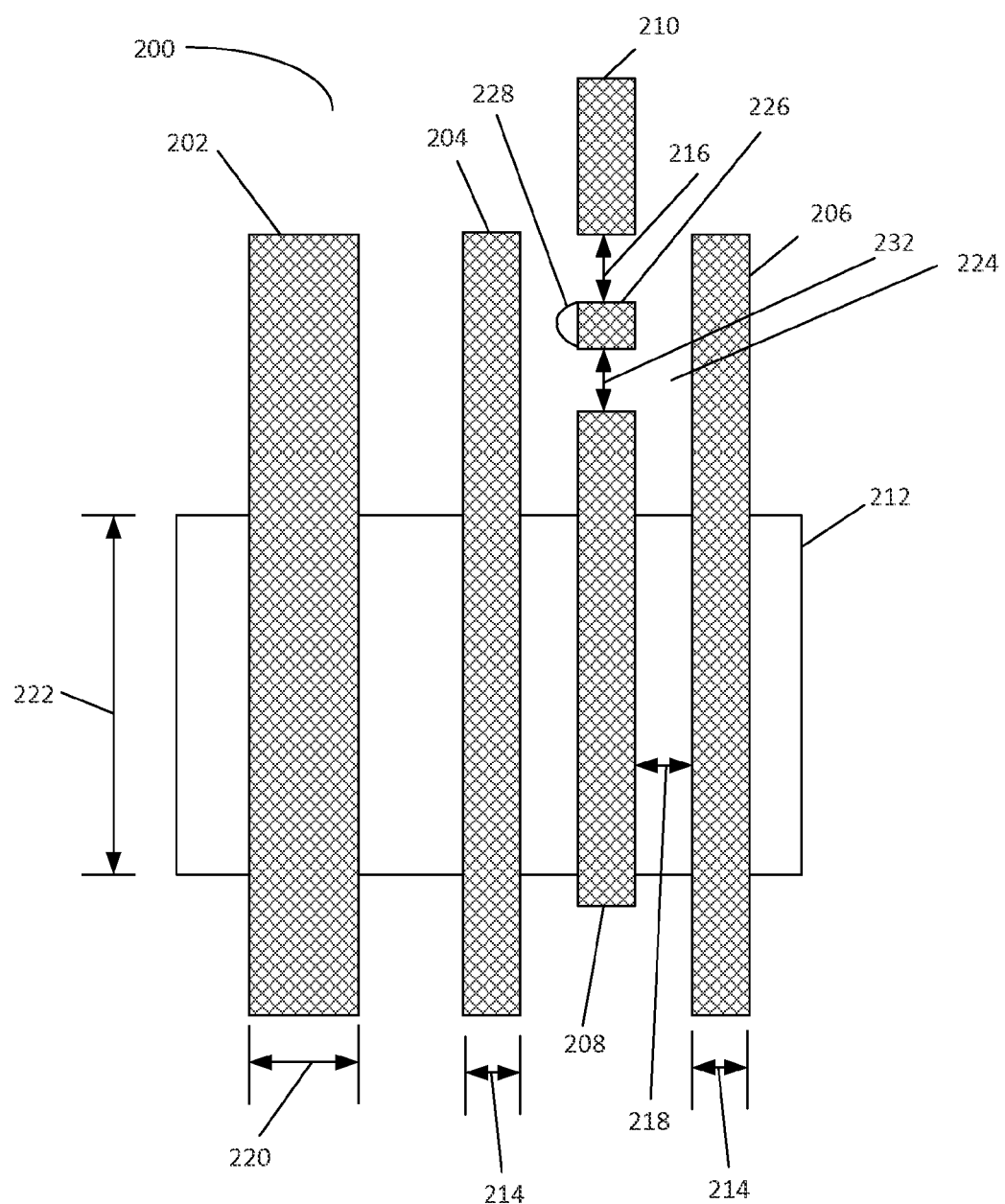
FIG. 2C illustrates a top view of features created on a semiconductor substrate in accordance with an aspect of the present disclosure.

FIGS. 2A-C illustrates a top view of features created on a semiconductor substrate in accordance with an aspect of the present disclosure.

To manufacture semiconductor device features, conventional lithographic techniques, as described with respect to FIGS. 1A-1E, are used to provide openings in the photoresist 102 for diffusion, contact pads, metallization, etc. Initially, lithographic feature sizes were in the 1 micron range, but as devices and device physics have been better utilized, conventional lithography techniques are currently in the 30 nanometer range (with sizes continuing to decrease). This creates higher density chips.

However, it is often desirable to create some features that are smaller than the lithographic feature limits of the technology being used to create the semiconductor chip. The present disclosure, in one or more aspects, enables creation of features on the chip that are smaller than the "conventional" lithographic thresholds used to create the chip features.

FIG. 2A illustrates an aspect of the present disclosure.

Conventional lithographic techniques are used on the chip 200 to create geometric areas, such as feature lines 202-210 and diffusion region 212. The feature lines 202-210, which may be local interconnects for transistors, other active devices, other passive devices, or for diffusion or other metallization regions, are made at the lithographic resolution (e.g., 20 nm) of the mask 104 and the exposure process described with respect to FIGS. 1A-1E, such that the widths 214-218 can be at the resolution of the lithographic process. So for example, and not by way of limitation, the widths 214-218 in a 20 nm lithographic process are approximately 20 nm. The actual widths 214-218 will vary slightly because of process variations, but are considered to be at the threshold of lithographic reproduction because smaller design widths cannot be consistently reproduced in such a process, and result in unexposed areas 122, as shown in FIG. 1E. For a small design width of 20 nm, the threshold for a line length can be in the range of 80-100 nm.

Of course, the widths 214-218 can be a larger value than the lithographic resolution of the processes being used with mask 104, which is shown in FIG. 2A as the width 220 of the feature line 202 and the width 222 of the diffusion region 212.

There are occasions in chip design when a dimension of a portion of a feature 202-210 is desired to be less than the lithographic resolution of the remainder of the chip. Rather than using a process that has greater resolution for the entire chip for these occasions, because that process may be more expensive, more time consuming, and result in possibly lower yields for chip manufacture, the present disclosure combines a low resolution process with a separate mask that allows for even lower resolution features.

So, for example, and not by way of limitation, the feature 208 may be designed to have a small portion that is used for a point contact, capacitor, or other circuit device or operation. The length of the small portion is smaller than the lithographic resolution of the remainder of the feature lines 202-210. FIG. 2B illustrates an aspect of the present disclosure that creates such a portion.

FIG. 2B illustrates a second mask feature 224, called a "cut mask" feature 224 to cut one of the feature lines 208, into two segments, feature 208 and feature 226. By proper placement of the cut mask feature 224, which may also be limited by the lithographic resolution similar to that of the original mask 104, (e.g., the length 230 of the "cut mask" feature 224 may be the same as that of the mask 104 that created the features 202-210) the size of the feature 226 can be selected such that the length 228 is less than the lithographic length resolution of the mask used to create feature 208 or the lithographic space resolution of the mask used to create the feature 224. By setting the location of the feature 224, and, if desired, the width of the features 208 and 224, the length 228 of the feature 226 can be a sub-threshold dimension (i.e., smaller than the lithographic length resolution), which allows for even denser connections and device packing. FIG. 2C illustrates the removal of the section of the feature 208, and the separation of the feature 226 in the area 232.

The cut mask feature 224 may have a different resolution or a different pitch limit, i.e., the dimension of the feature 224 from left to right as seen in FIG. 2B, than the original mask 104. Further, the cut mask feature 224 can be created by a separate mask, or can be created using other photolithographic techniques, without departing from the scope of the present disclosure. However, the feature 226 has a length smaller than the lithographic length resolution than either mask. Further, the cut mask feature 224 and cut mask process may be performed using patterning, as through a metalized layer or through other semiconductor or photoresist layers.

So, for example, feature 210 and feature 208 may be patterned as a first portion and a second portion of a single feature, and they may be separated by a predetermined distance 216. The predetermined distance 216 may be a line tip to tip space, a line space, or a line length resolution of a lithographic process having a specified width resolution.

As shown in FIG. 2C, the feature 208 may be patterned with a cut mask or in other ways to form a first sub-portion 226 and a second sub-portion 228 in which a dimension 228 of the first sub-portion 226 is less than a dimension of the predetermined distance 216. Again, the predetermined distance 216, or spacing 216, may be a line tip to tip space, a line space, or a line length resolution of a lithographic process having a specified width resolution.

As such, the cut mask feature 224 may be Obtained via patterning the features 202-210 and then patterning the cut mask feature 224 to form an etch block region at feature 224 site. In such a way, the cut mask is in reality a "block mask".

Any combination of patterning, etching, or other lithographic techniques may be used without departing from the scope of the present disclosure.

The top end of the feature 226, may have some curvature rather than being straight. Further, the bottom end of the feature 226 is straight due to the cut mask. Such characteristics of the feature 226 and/or the feature 208 can be detected using tunneling electron microscopy or scanning electron microscopy.

Figure 3:
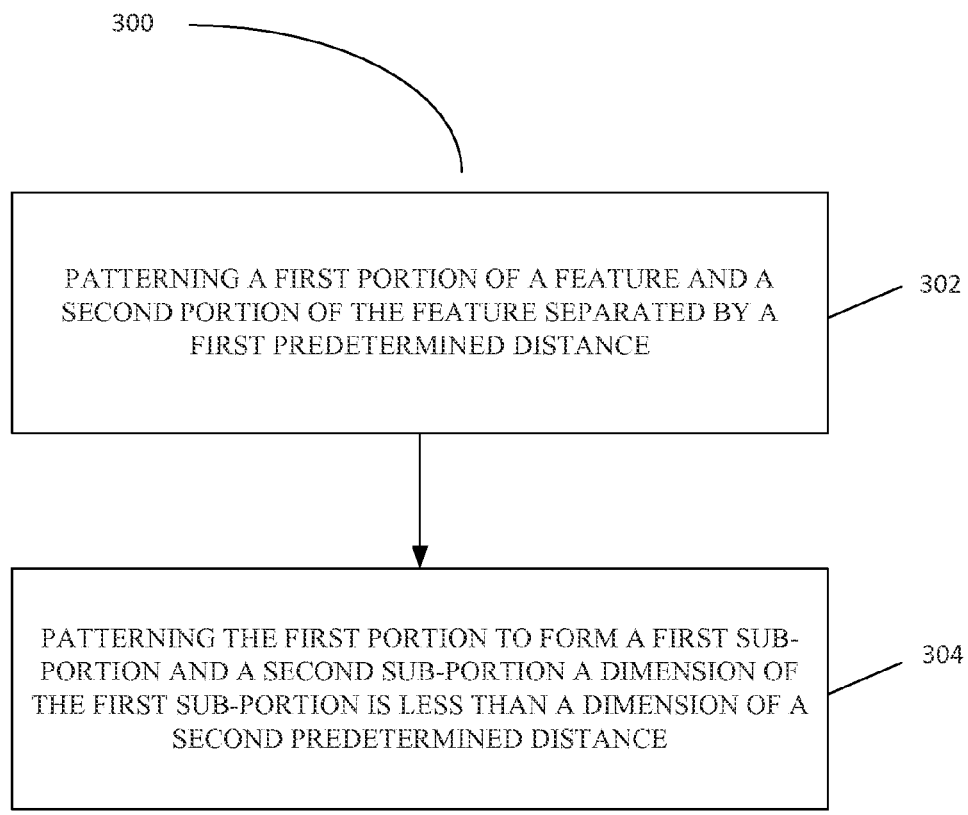
FIG. 3 is a flow chart illustrating an example of a method according to one aspect of the disclosure.

FIG. 3 is a flow chart illustrating an example of a method according to one aspect of the disclosure.

As seen in a flowchart 300, at block 302, a first portion of a feature and a second portion of the feature are patterned. The features, e.g., portions of the local interconnects, are separated by a first predetermined distance. The first predetermined distance can be a line tip to tip space or a line space. In block 304, the first portion is patterned with a cut mask to form a first sub-portion (e.g., contact) and a second sub-portion. A dimension of the first sub-portion is less than a dimension of a second predetermined distance. The second predetermined distance can be a line length resolution of a lithographic process having a specified width resolution. After all of the patterning, etching may occur to create the features and contacts.

According to a further aspect of the present disclosure, an apparatus for making a semiconductor device has means for patterning a first portion of a feature and a second portion of the feature separated by a first predetermined distance. The apparatus also has means for patterning the first portion to form a first sub-portion and a second sub-portion. The means for patterning the first portion and the second portion may be the lithographic mask 208, 210. The means for patterning the first sub-portion and the second sub-portion may be the cut mask 224. In another aspect, the aforementioned means may be any module or any apparatus configured to perform the functions recited by the aforementioned means.

Figure 4:
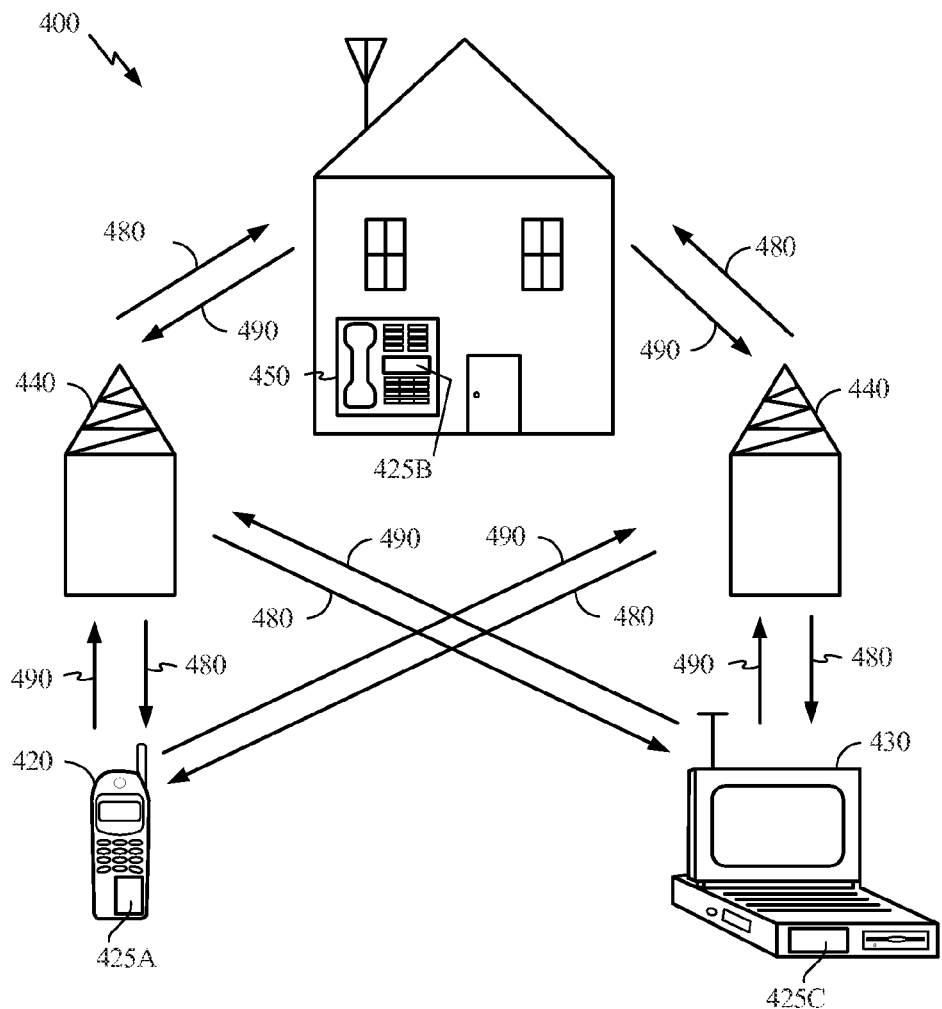
FIG. 4 is a block diagram showing an exemplary wireless communication system in which an aspect of the disclosure may be advantageously employed.

FIG. 4 is a block diagram showing an exemplary wireless communication system 400 in which an aspect of the disclosure may be advantageously employed. For purposes of illustration, FIG. 4 shows three remote units 420, 430, and 450 and two base stations 440. will be recognized that wireless communication systems may have many more remote units and base stations. Remote units 420, 430, and 450 include IC devices 425A, 425C, and 425B, which include the disclosed sub threshold features. It will be recognized that any device containing an IC may also include the sub threshold features disclosed here, including the base stations, switching devices, and network equipment. FIG. 4 shows forward link signals 480 from the two base stations 440 to the remote units 420, 430, and 450 and reverse link signals 490 from the remote units 420, 430, and 450 to the two base stations 440.

In FIG. 4, one of the remote units 420 is shown as a mobile telephone, one of the remote units 430 is shown as a portable computer, and one of the remote units 450 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 4 illustrates remote units according to the teachings of the disclosure, the disclosure is not limited to these exemplary illustrated units. Aspects of the disclosure may be suitably employed in any device, which includes integrated circuits (ICs) having sub threshold features.

Figure 5:
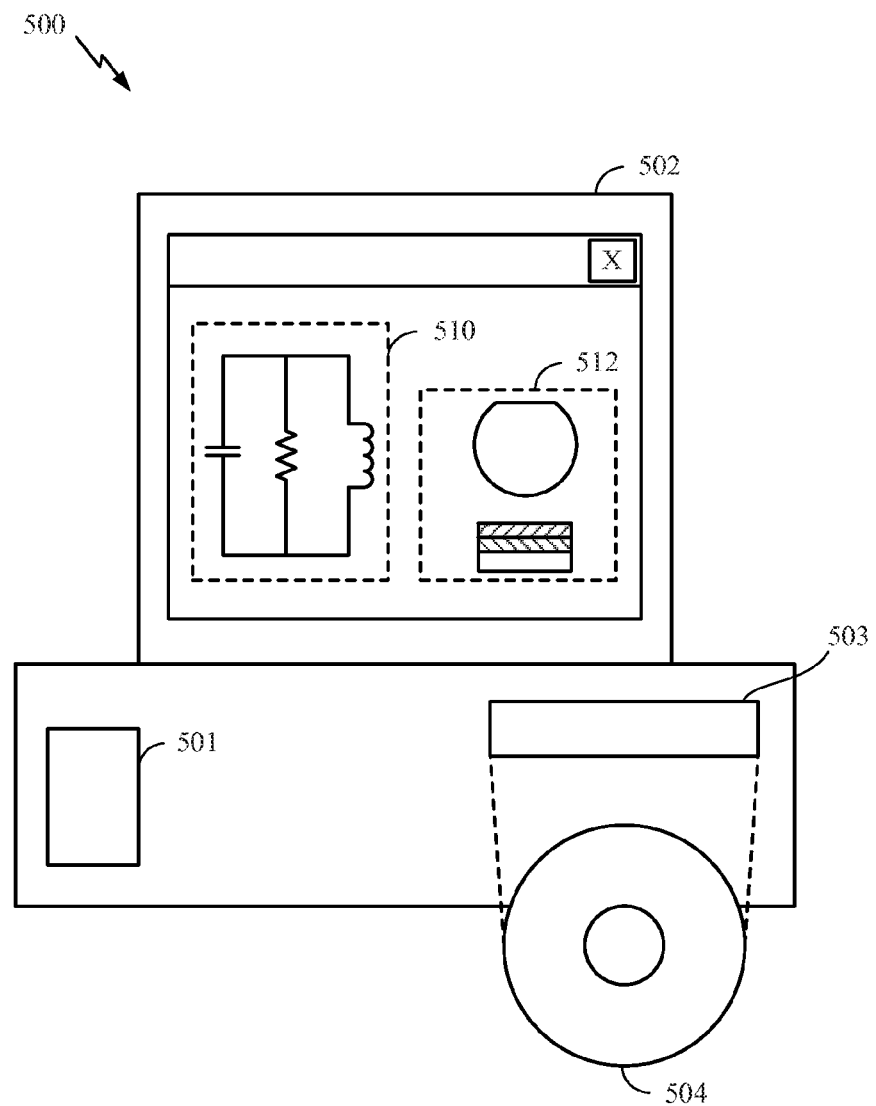
FIG. 5 is a block diagram illustrating a design workstation used for circuit, layout, and logic design of a semiconductor component.

FIG. 5 is a block diagram illustrating a design workstation used for circuit, layout, and logic design of a semiconductor component, such as circuitry having sub threshold features as disclosed above. A design workstation 500 includes a hard disk 501 containing operating system software, support files, and design software such as Cadence or OrCAD. The design workstation 500 also includes a display 502 to facilitate a circuit design 510 or a semiconductor component 512 such as the disclosed sub threshold features. A storage medium 504 is provided for tangibly storing the circuit design 510 or the semiconductor component 512. The circuit design 510 or the semiconductor component 512 may be stored on the storage medium 504 in a file format such as GDSII or GERBER. The storage medium 504 may be a CD-ROM, DVD, hard disk, flash memory, or other appropriate device. Furthermore, the design workstation 500 includes a drive apparatus 503 for accepting input from or writing output to the storage medium 504.

Data recorded on the storage medium 504 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 504 facilitates the design of the circuit design 510 or the semiconductor component 512 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is specified to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular aspects of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present disclosure. Accordingly, the appended claims are intended to include within their scope such processes, machines, manufacture, compositions of matter, means, methods, or steps.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, in which reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A semiconductor device, comprising:
 a first portion of a feature and a second portion of the feature separated by a first predetermined distance, the first predetermined distance being a lithographic resolution of a first mask used to pattern the first portion and the second portion; and
 the first portion comprising a first sub-portion and a second sub-portion, in which a dimension of the first sub-portion is less than a dimension of a second predetermined distance, and the second predetermined distance being a line length resolution of a lithographic process having a specified width resolution, and/or a lithographic resolution of a cut mask used to pattern the first and second sub-portions.

2. The semiconductor device of claim 1, in which the feature is a local interconnect.

3. The semiconductor device of claim 1, in which the dimension is less than a lithographic resolution of a mask used to pattern the first portion.

4. The semiconductor device of claim 1, in which the dimension is less than a lithographic resolution of a mask used to pattern the second portion.

5. The semiconductor device of claim 1, in which the second portion further comprises a conductive material forming an electrical contact point to the second portion.

6. The semiconductor device of claim 1, wherein the second portion is etched from the first portion.

7. The semiconductor device of claim 1, integrated into a mobile phone, a set top box, a music player, a video player, an entertainment unit, a navigation device, a computer, a handheld personal communication systems (PCS) unit, a portable data unit, and/or a fixed location data unit.

* * * * *